United States Patent
Müller et al.

(10) Patent No.: US 9,053,802 B2
(45) Date of Patent: Jun. 9, 2015

(54) FERROELECTRIC MEMORY CELL FOR AN INTEGRATED CIRCUIT

(71) Applicant: NaMLab gGmbH, Dresden (DE)

(72) Inventors: Stefan Ferdinand Müller, Dresden (DE); Ekaterina Yurchuk, Dresden (DE); Uwe Schröder, Dresden (DE)

(73) Assignee: NaMLab gGmbH, Dresden (DE)

( * ) Notice: Subject to any disclaimer, the term of this patent is extended or adjusted under 35 U.S.C. 154(b) by 75 days.

(21) Appl. No.: 13/909,394

(22) Filed: Jun. 4, 2013

(65) Prior Publication Data

US 2014/0355328 A1    Dec. 4, 2014

(51) Int. Cl.
G11C 11/22    (2006.01)

(52) U.S. Cl.
CPC ........ G11C 11/2275 (2013.01); G11C 11/2273 (2013.01)

(58) Field of Classification Search
USPC .......................................... 365/117, 145, 161
See application file for complete search history.

(56) References Cited

U.S. PATENT DOCUMENTS

| | | | |
|---|---|---|---|
| 6,255,121 B1 | 7/2001 | Arita et al. | |
| 7,226,795 B2 | 6/2007 | Sakai | |
| 8,304,823 B2 | 11/2012 | Boescke | |
| 2004/0214352 A1 | 10/2004 | Kijima et al. | |
| 2006/0017120 A1 | 1/2006 | Sakai | |
| 2006/0044863 A1 | 3/2006 | Basceri et al. | |
| 2006/0056225 A1 | 3/2006 | Hashimoto et al. | |
| 2009/0020744 A1* | 1/2009 | Mizukami et al. | 257/4 |
| 2009/0092032 A1* | 4/2009 | Siegert et al. | 369/126 |
| 2009/0261395 A1* | 10/2009 | Boescke | 257/295 |
| 2012/0018844 A1* | 1/2012 | Hafezi | 257/532 |

FOREIGN PATENT DOCUMENTS

| | | |
|---|---|---|
| DE | 10046021 A1 | 5/2001 |
| DE | 102004011432 A1 | 9/2005 |

OTHER PUBLICATIONS

Depolarization Corrections to the Coercive Field in Thin-Film Ferroelectrics, Dawbert et al., University of Cambridge U.K., all pages.*
Kakemoto et al., "Ferroelectric properties of BaTi0.91 (Hf0.5Zr 0.5) 0.09O3 thin films fabricated by pulsed laser deposition method", Applications of Ferroelectrics, 2000, ISAF 2000. Proceedings of the 2000 12th IEEE International Symposium on, vol. 2, pp. 603-606.

* cited by examiner

*Primary Examiner* — Fernando Hidalgo
(74) *Attorney, Agent, or Firm* — Edell, Shapiro & Finnan LLC (57) ABSTRACT

An integrated circuit includes a ferroelectric memory cell. In one embodiment, the ferroelectric memory cell includes a first oxide storage layer, a second oxide storage layer, and an amorphous layer disposed between the first and second oxide storage layers. Each of the first and second oxide storage layers includes a ferroelectric material that is at least partially in a ferroelectric state and further includes, as main components, oxygen and any of the group consisting of Hf, Zr and (Hf,Zr).

26 Claims, 7 Drawing Sheets

FERROELECTRIC MEMORY CELL FOR AN INTEGRATED CIRCUIT

BACKGROUND

Many electronic devices and systems have the capability to store and retrieve information in a memory structure. A number of different memory structures are used in such systems. One prominent volatile memory is a DRAM structure that allows for high speed and high capacity data storage. Some examples of non-volatile memory structures include ROM, ferroelectric structures (e.g., FeRAM and FeFET devices) and MRAM structures.

With regard to ferroelectric (FE) structure, these structures can be in the form of a capacitor (e.g., a FeRAM) or a transistor (FeFET), where information can be stored as a certain polarization state of the ferroelectric material within the structure. The ferroelectric material that can be used is hafnium dioxide or zirconium dioxide or a solid solution of both transition metal oxides. In the case of pure hafnium oxide, the remanent polarization can be improved by a certain amount of dopant species has to be incorporated into the $HfO_2$ layer during the deposition.

The ferroelectric material is intended to partially or fully replace the gate oxide of a transistor or the dielectric of a capacitor. The switching is caused by applying an electrical field via voltage between transistor gate and transistor channel. Specially, for n-channel transistors, ferroelectric switching after application of a sufficiently high positive voltage pulse causes a shift of the threshold voltage to lower or negative threshold voltage values. For p-channel transistors a negative voltage pulse causes a shift of the threshold voltage to higher or positive threshold voltage values.

A problem that can occur is that minority carrier trapping from the channel region can shift the threshold voltage of transistors oppositely to the direction caused by ferroelectric switching. Accordingly, it is desirable to avoid charge trapping for a ferroelectric non-volatile memory device. Other negative impacts of trapping are increased leakage current and earlier breakdown of the ferroelectric/interfacial layer causing a reduced lifetime of the ferroelectric transistor or capacitor. In order to do this, the ferroelectric properties of the ferroelectric material must be improved to improve the lifetime of the ferroelectric device.

However, even with improvements to the ferroelectric properties, charge trapping within the ferroelectric layer cannot be avoided completely. For example, due to the ability to make $HfO_2$ thin together with a very thin interface layer while still maintaining its ferroelectric properties (low dead layer effect), charge trapping becomes much more critical compared to other ferroelectric materials such as PZT or SBT. For PZT or SBT materials, a layer thickness must be about 100 nm combined with a thick interface layer used as barrier which in turn renders charge trapping less critical or prevents it completely. To improve the sensing (the same as reading) and memory window of the device with thin ferroelectric materials, electrical de-trapping can be carried out by applying an additional voltage pulse. The voltage pulse, while unloading the traps, should however not disturb the ferroelectric state of the gate material.

Thus, it is desirable to minimize charge trapping such that the polarization state of the FE material is not adversely affected.

SUMMARY

In accordance with embodiments described herein, an integrated circuit comprises a ferroelectric memory cell. The ferroelectric memory cell comprises a first oxide storage layer, a second oxide storage layer and an amorphous layer disposed between the first and second oxide storage layers. Each of the first and second oxide storage layers comprises a ferroelectric material that is at least partially in a ferroelectric state and further comprises, as main components, oxygen and any of the group consisting of Hf, Zr and (Hf, Zr).

In other embodiments described herein, a ferroelectric memory cell comprises a first oxide storage layer and a plurality of bi-layers disposed consecutively in a stacked arrangement over the first oxide storage layer, where each bi-layer comprises an amorphous layer and an oxide storage layer disposed over the amorphous layer. Each of the oxide storage layers comprises a ferroelectric material that is at least partially in a ferroelectric state and further comprises, as main components, oxygen and any of the group consisting of Hf, Zr and (Hf, Zr).

In accordance with other embodiments described herein, a method is provided for writing a ferroelectric memory cell of a ferroelectric memory. As used herein, the term "writing" refers to setting of one of the memory states as either "1" with a high threshold voltage value or "0" with a low threshold voltage value. Thus, the term "writing" can mean one of two sub-operations: programming (setting a high threshold voltage state), or erase (setting a low threshold voltage state). The ferroelectric memory cell comprises a ferroelectric storage layer, and the ferroelectric memory further comprises a voltage source to apply a voltage to the ferroelectric storage layer, the method comprising applying a write voltage pulse sequence to the ferroelectric storage layer via the voltage source. The write voltage pulse sequence comprises applying a pulse with an amplitude equal or higher than the coercive voltage having a value of $U_C$ that is suitable to change a polarity of the ferroelectric storage layer, and applying a detrapping pulse of opposite polarity having a value of $F^*-U_C$, wherein F is greater than zero and less than 1 and $-U_C$ is the coercive voltage needed to switch polarization into the opposite direction.

The above and still further features and advantages of embodiments of the present invention will become apparent upon consideration of the following detailed description thereof, particularly when taken in conjunction with the accompanying drawings wherein like reference numerals in the various figures are utilized to designate like components.

DETAILED DESCRIPTION

In accordance with embodiments described herein, a ferroelectric memory cell of an integrated circuit comprises a structure including an intermediate amorphous layer disposed within a ferroelectric material comprising, as a main component, oxygen and any one or more of Hf (hafnium) and Zr (zirconium). The intermediate amorphous layer prevents the formation of crystals within the ferroelectric structure that extend throughout the entire dimension of the thickness of the ferroelectric structure. This in turn reduces the leakage current that may otherwise occur at the crystal boundaries of the ferroelectric structure, reduces charge trapping and also increases the endurance of the structure.

Figure 1:
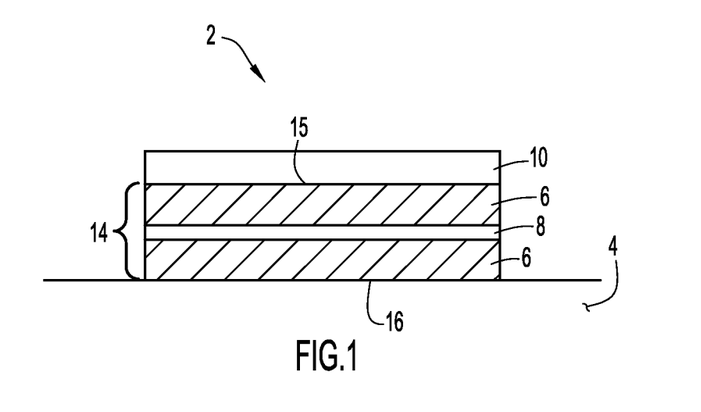
FIG. 1 depicts a cross-sectional view of an example embodiment of a metal ferroelectric semiconductor (MFS) structure in accordance with the present invention.

The ferroelectric memory cell structure can be formed, e.g., as a metal ferroelectric semiconductor (MFS) structure (e.g., for FeFET structures) as depicted in FIG. 1. The ferroelectric memory cell can also be formed as a metal ferroelectric metal (MFM) structure (e.g., for FeRAM structures) as depicted in the cross-sectional view of FIG. 2.

Referring to the cross-sectional view of FIG. 1, an example embodiment of a MFS structure 2 includes a support structure 4 comprising a carrier material, such as a silicon compound. A first oxide storage layer 6 (also referred to herein as an oxide layer or a ferroelectric material oxide layer) is formed over layer 4 and comprises a ferroelectric material.

The term "ferroelectric material", as used herein, refers to a material that is at least partially in a ferroelectric state and further comprises, as main components, oxygen and any of the group consisting of Hf, Zr and (Hf,Zr). For example, the ferroelectric material may comprise any of $HfO_2$, $ZrO_2$, any ratio of Hf and Zr combined with oxygen (e.g., $Zr_xHf_{1-x}O_2$, where x<1) as well as any combinations thereof. In addition, the term "main components", as used herein, refers to any suitable number of O and any one or combinations of Hf, Zr and (Hf, Zr) per volumetric content, e.g. unit cell, that is higher compared to any other components or further additives introduced in any suitable manner into a ferroelectric material oxide layer.

An amorphous oxide layer 8 is formed over the first ferroelectric material oxide layer 6. The amorphous oxide layer 8 comprises any suitable material which is amorphous at ferroelectric $HfO_2$ crystallization temperature, e.g. SiO, AlO, GdO, ScO and LaO. The performance of a ferroelectric device can be improved by any suitable materials having a band gap that is similar in range to the ferroelectric materials of the first oxide layer 6. In particular, suitable materials for the amorphous oxide layer 8 comprise any materials having a band gap larger than about 3 eV. For example, materials for the amorphous oxide layer 8 can comprise any materials having a band gap in the range from about 5.5 eV to about 6.5 eV. Some non-limiting examples of oxides that can be used to form the amorphous oxide layer 8 include, scandium oxide (e.g., $Sc_2O_3$), gadolinium oxide ($Gd_2O_3$) and lanthanum oxide ($La_2O_3$). A second ferroelectric material oxide layer 6 is provided over the amorphous oxide layer 8, and a conductive layer 10 is formed over layer 6. The conductive layer 10 can comprise any one or more suitable conductive metals including, without limitation, TiN, TaN, TaCN, WCN, Ru, Re, RuO, Pt, Ir, IrO, Ti, TiAlN, TaAlN, W, WN, C, Si, Ge, SiGe and NbCN.

Figure 2:
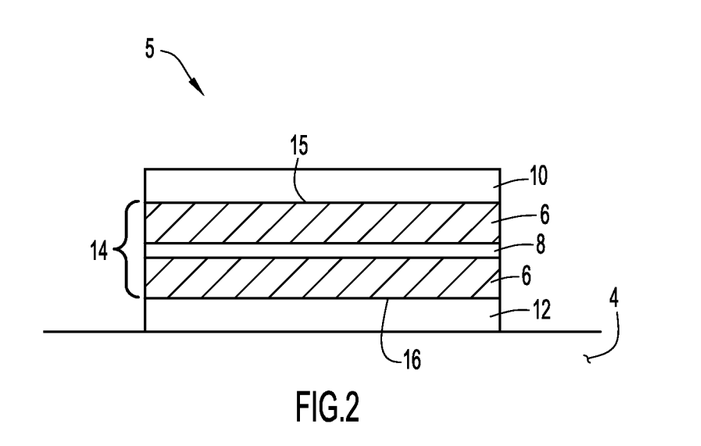
FIG. 2 depicts a cross-sectional view of an example embodiment of a metal ferroelectric metal (MFM) structure in accordance with the present invention.

An example embodiment of a MFM structure 5 includes the support structure 4, and a conductive layer 12 formed over the support structure 4, where the conductive layer can be formed of conductive materials such as described herein in relation to layer 10. A first ferroelectric material oxide layer 6, followed by an amorphous oxide layer 8 and then a second ferroelectric material layer 6 are disposed over the conductive layer 12. A conductive layer 10 is disposed over the second ferroelectric material layer 6.

An example process for forming each of the MFS and MFM structures of FIGS. 1 and 2 is described as follows. A carrier structure 4 is provided that may comprise a Si (silicon) compound, such as SiGe (silicon-germanium) or silicon-on-insulator (SOI). It is noted that other semiconductor materials can also be provided as the carrier structure 4 including, e.g., III-V semiconductor compounds such as GaAs or any other suitable substrate material. The carrier structure 4 may have already been processed so as to include components and/or other devices already be formed within the carrier structure.

For the MFM structure of FIG. 2, the conductive layer 12 can be deposited via any suitable process over the support structure 4. Some examples of formation processes that can be used to form conductive layers 10 and 12 include atomic layer deposition (ALD), metal organic atomic layer deposition (MOALD), chemical vapor deposition (CVD), metal organic chemical vapor deposition (MOCVD), physical vapor deposition (PVD), or any other suitable deposition technique that facilitates formation of the conductive layers utilizing one or more suitable conductive materials as previously described herein. The conductive layer 12 can be formed having a suitable thickness dimension, e.g., in the range from about 2 nm to about 500 nm, or in a range from about 2 nm to about 50 nm.

The first ferroelectric material oxide layer 6 is formed on the conductive layer 12 for the MFM structure 5 of FIG. 2, while the first ferroelectric material oxide layer 6 is formed on the support structure 4 for the MFS structure 2 of FIG. 1. In each embodiment, layer 6 can be formed utilizing any one of atomic layer deposition (ALD), metal organic atomic layer deposition (MOALD), chemical vapor deposition (CVD), metal organic chemical vapor deposition (MOCVD), physical vapor deposition (PVD), molecular beam epitaxy (MBE) deposition, Sol-gel or any other suitable deposition technique that facilitates formation of the layer including the ferroelectric material as described herein (i.e., oxygen and at least one of Hf and Zr), where growth of each layer can be single-crystalline or poly-crystalline. Any suitable number and types of precursors may be utilized to introduce elements such as Hf and Zr into the layer 6 utilizing any of the deposition techniques as described herein. The layer 6 is formed to have a suitable thickness, e.g., in the range from about 2 nm to 500 nm. In an example embodiment, the thickness range from layer 6 can be within the range from about 2 nm to about 50 nm.

The amorphous oxide layer 8 is formed over the first ferroelectric material oxide layer 6 utilizing any suitable deposition process capable of forming the layer 8 at a very small thickness in relation to each ferroelectric material layer 6. For example, an atomic layer deposition (ALD) process can be utilized to from the layer 8 over the first ferroelectric material oxide layer 6, where the thickness of the amorphous oxide layer 8 can be from about 1 Angstrom to about 100 Angstroms, and further can be from about 1 Angstrom to about 30 Angstroms. Any suitable precursors may be utilized to facilitate forming of the amorphous oxide layer (e.g., $Al_2O_3$, $SiO_2$, $Gd_2O_3Sc_2O_3$, or $La_2O_3$) at suitable thickness levels utilizing ALD or any other suitable deposition technique.

The second ferroelectric material oxide layer 6 is formed over the amorphous oxide layer 8 for both embodiments of FIGS. 1 and 2 in the same or similar manner as the first ferroelectric material oxide layer 6. The second ferroelectric material oxide layer 6 can include the same or different ferroelectric material as the first ferroelectric material oxide layer 6. For example, the first ferroelectric material oxide layer 6 may include $HfO_2$, while the second ferroelectric material oxide layer 6 includes a combination of Hf, Zr and oxygen. Any other possible combinations of different ferroelectric materials for the first and second ferroelectric material oxide layers 6 are also possible.

The combination of the first and second ferroelectric material oxide layers 6 and the amorphous oxide layer 8 defines a combined ferroelectric material oxide layer 14. The second ferroelectric material oxide layer 6 can be formed to have a thickness within the same ranges as previously noted for the first ferroelectric material oxide layer 6. For example, each of the first and second ferroelectric material oxide layers 6 can have the same or substantially similar thicknesses, resulting in the amorphous oxide layer 8 being located at or substantially near a center location of the combined ferroelectric material oxide layer 14. Alternatively the first and second ferroelectric material oxide layers 6 can have different thicknesses, resulting in the amorphous oxide layer 8 being located closer in distance to a top side 15 in relation to a rear side 16 of the ferroelectric material oxide layer 14 or vice versa for each of the MFS and MFM embodiments of FIGS. 1 and 2. The thickness of the combined ferroelectric material oxide layer 14 can be within the range from about 3 nm to about 1000 nm, or from about 3 nm to about 50 nm.

In addition, one or both of the first and second ferroelectric material oxide layers 6 can be formed to include, in addition to the ferroelectric material, dopants or further additives that may support the crystallization of the layer 6 into a state having ferroelectric properties. The additives can be included with the precursor materials, e.g., so as to be included during formation of the layer 6. Alternatively, the additives can be introduced into the formed layer 6 by ion implantation or any other suitable process. A concentration of the further additives within the layer may be set within a range from about 0.05 at % (atomic percent, as measured by ratio of additive atoms to ferroelectric material atoms) to about 30 at %, within a range from about 0.05 at % to about 10 at %, within a range from about 0.05 at % to about 5 at %, within a range from about 0.5 at % to about 3.5 at %, or a range from about 1 at % to about 3.5 at %. In general, the amount of the further additives may depend on the thickness of the layer 6. When increasing the thickness of the layer 6, the concentration of the further additives may also have to be increased to achieve a desired crystallization having ferroelectric properties. The first and second ferroelectric material oxide layers 6 can include the same or a different number, types and/or concentrations of additives.

Figure 4:
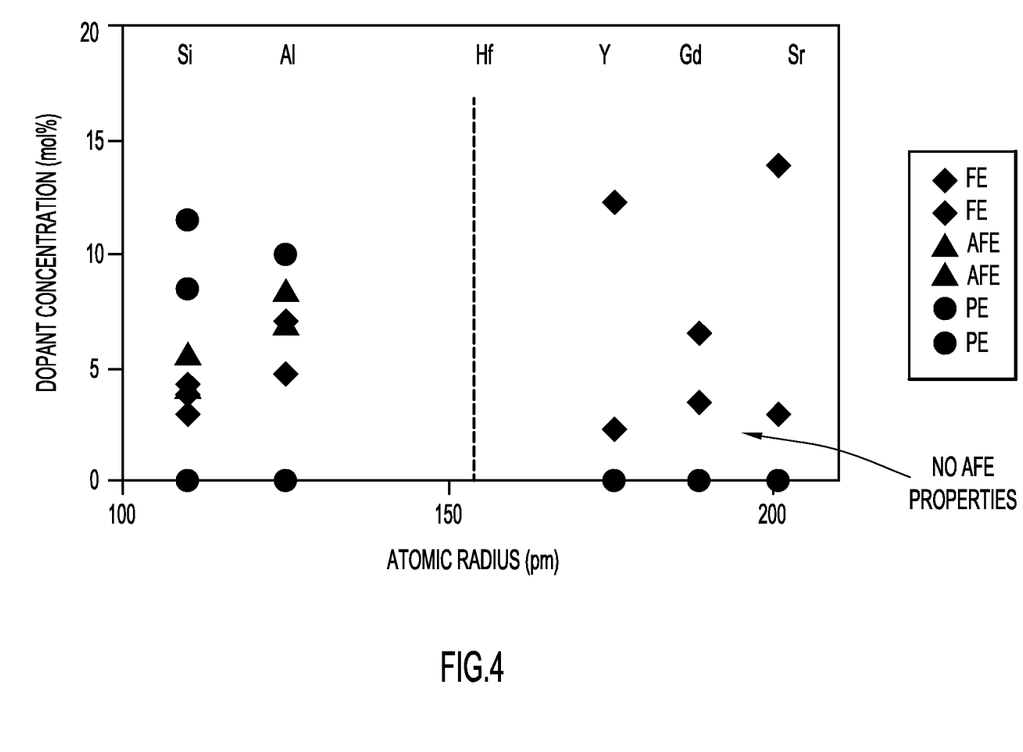
FIG. 4 is a plot of atomic radius vs. dopant concentration for elements having radii both greater and smaller than hafnium, and further showing ferroelectric, anti-ferroelectric and paraelectric properties of ferroelectric material oxide layers formed with these elements at the different concentrations within the layers.

Any suitable additives may be provided within the ferroelectric material oxide layer 6 including, without limitation, any one or more of C, Si, Al, Ge, Sn, Sr, Pb, Mg, Ca, Sr, Ba, Ti, Zr (e.g., providing Zr as an additive in a $HfO_2$ layer), Ti, and any one or more of the rare earth elements (e.g., Y, Gd, etc.). In particular, it has been determined that certain additives having an atomic radius that is about the same as or greater than Hf are particularly suitable as dopants for optimizing ferroelectric (FE) properties of the ferroelectric material oxide layer 6 when utilizing Hf in the layer. In contrast, certain additives having an atomic radius smaller than Hf can cause anti-ferroelectric (anti-FE) properties at phase boundaries between the monoclinic and tetragonal/cubic phases of $HfO_2$. It has further been determined that additives having an atomic radius about the same as or greater than Hf can be doped at larger ranges of concentrations within the ferroelectric material oxide layer in relation to other additives while still supporting FE properties of the ferroelectric material oxide layer. Other additives having the same valence as Hf can also be beneficial as dopants to reduce charge trapping characteristics of the ferroelectric material oxide layer by reducing open bonds within the $HfO_2$ host lattice of the layer. An example of a plot showing elements and their atomic radii in relation to Hf is depicted in the plot of FIG. 4 to show the effectiveness of such elements as dopants in a ferroelectric material oxide layer. In particular, the atomic radius (pm) of each element vs. dopant concentration (at %) for each element is shown at data points indicating the properties of the formed ferroelectric material oxide layer resulting from such doping: FE (ferroelectric), AFE (anti-ferroelectric) and PE (paraelectric). As indicated by the data plotted in FIG. 4, elements such as Y, Gd and Sr (each of which has a greater atomic radius than Hf) can be doped in the ferroelectric material oxide layer at a broad range of dopant concentrations (e.g., 1 at % to 14 at % or greater) resulting in the ferroelectric material oxide layer exhibiting FE properties and no AFE properties. In contrast, elements such as Si and Al (each having an atomic radius less than Hf) provide a much smaller dopant concentration range in which the ferroelectric material oxide layer can have both exhibit ferroelectric as well as antiferroelectric properties.

The conductive layer 10 for each of the embodiments of FIGS. 1 and 2 is formed over the combined ferroelectric material oxide layer 14, e.g., in the same or similar manner as previously described in relation to conductive layer 12. The conductive layer can also be formed from any of the types of conductive materials as previously described for conductive layer 12, and the thickness of conductive layer 10 can be within the same range or ranges as previously noted for conductive layer 12. The conductive layers 10 and 12 for the MFM embodiment of FIG. 2 can have the same or different thicknesses.

The conductive layer 10 for the embodiments of FIGS. 1 and 2 provides a covering layer for the combined ferroelectric material oxide layer 14 and can also serve as an electrode (e.g., gate electrode) for the implementation of the MFS or MFM within a semiconductor memory cell structure.

In an alternative embodiment, a further covering layer can also be provided between the second ferroelectric material oxide layer 6 and conductive layer 10. The further covering layer can be deposited prior to forming the conductive layer 10 utilizing any suitable deposition process such as any of the previously described processes, and the further covering layer can comprise any suitable materials such as $SiO_2$, $Al_2O_3$, $Sc_2O_3$, $Y_2O_3$, BaO, MgO, SrO, $Ta_xO_y$, $Nb_xO_y$, TiO, and lanthanum dioxides. The further covering layer may also be formed in a same deposition process with the second ferroelectric material oxide layer 6 by changing the supply of source/precursor materials during the deposition process (thus allowing the deposition to be performed within the same deposition chamber). For example, when forming the second ferroelectric material oxide layer 6 from $HfO_2$, a precursor gas including oxygen may be continuously provided during deposition of the amorphous layer and the further covering layer. Hafnium precursor gas may be included with the oxygen precursor gas first in the deposition chamber to form the layer 6, where the hafnium precursor gas flow is then switched to a precursor gas flow (e.g., Si) to with the continuing flow of oxygen to form the further covering layer (e.g., $SiO_2$).

Figure 3:
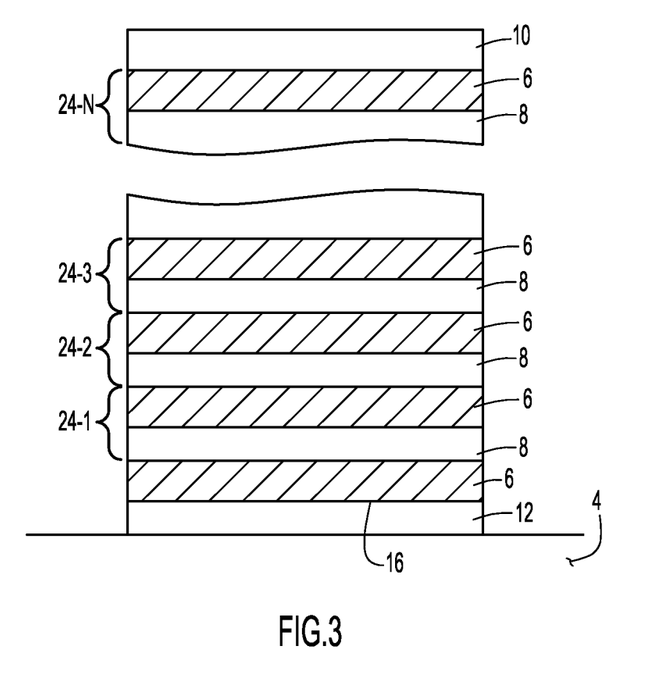
FIG. 3 depicts a cross-sectional view of an example embodiment of another metal ferroelectric metal (MFM) structure in accordance with present invention.

In a further embodiment, a ferroelectric memory cell can be formed comprising a first ferroelectric material oxide layer and a plurality of bi-layers disposed consecutively in a stacked arrangement over the first oxide storage layer, where each bi-layer comprises an amorphous layer and an ferroelectric material oxide layer disposed over the amorphous layer. Each of the ferroelectric material layers comprises a ferroelectric material. An example embodiment is depicted in FIG. 3, in which a first conductive layer 12 as previously described herein is formed on the support structure 4, followed by a first ferroelectric material oxide layer 6 as previously described herein formed over the conductive layer 12. A series of bi-layers 24-1, 24-2, 24-3, . . . 24-N are consecutively formed in a stacked arrangement over the first ferroelectric material oxide layer 6. Each bi-layer comprises an amorphous layer 8 as previously described herein and a ferroelectric material oxide layer 6 formed over the amorphous layer 8. A second conductive layer 10 as previously described herein is formed over the bi-layer 24-N. In this embodiment, a combined ferroelectric material oxide layer is defined by the combination of layers 6 and 8. Any suitable number of bi-layers can be provided over the first ferroelectric material oxide layer 6 including, without limitation, a single bi-layer, five bi-layers, ten bi-layers, 20 bi-layers, 30 bi-layers, 50 bi-layers, 100 bi-layers, or more (e.g., at least about 100 bi-layers).

After the layers have been formed, an anneal process is carried out for the structure 2 of FIG. 1 and the structure 5 of FIG. 2 (or the structure of FIG. 3) at one or more suitable temperatures and for one or more suitable time periods to achieve a suitable amount of crystallization for the ferroelectric material within the combined ferroelectric material oxide layer 14. In particular, the anneal process is carried out to heat the combined ferroelectric material oxide layer 14 to a temperature that is above the crystallization temperature of the ferroelectric material so as to at least partially alter its crystal state from amorphous to crystalline, thus resulting in a crystallized oxide within the ferroelectric material oxide layers 6. A crystallization temperature may be chosen in a range of, e.g., from about 400° C. to about 1200° C. depending on the thermal budget of the used devices (including capacitors, gate first and gate last devices). A preferred crystalline temperature for the annealing process is at a temperature that is above the onset of crystallization for the ferroelectric material (when the ferroelectric material is amorphous, i.e., after the layer 6 is deposited and before annealing occurs) and is further greater than about 500° C., or at a temperature that is above the onset of crystallization for the ferroelectric material and is further greater than about 300° C. The time period for annealing can be from about 0.01 second to about 12 hours. These annealing temperature ranges induces partial crystallization of the ferroelectric material oxide layers 6 (e.g., crystallization to a suitable level within the layers 6 that is less than complete crystallization of the ferroelectric material) while keeping diffusion of dopants within the layers to a minimum.

The partial crystallization of the ferroelectric material oxide layers 6 results in ferroelectric domains within the layers 6 that are in a ferroelectric state (e.g., at least partially). The crystallized layers 6 may exhibit different dipole moments and may thus affect the conductivity throughout the combined ferroelectric material oxide layer 14. The orientation of the dipole moments in the crystallized layers 6 can be adjusted with the help of the external voltage. In this way, the dipole orientation of the partially ferroelectric material oxide layer 14 may be utilized for storage of an information state. For example, as described below, the MFS structure 2 can be used to form a FeFET, where the channel conductivity in the FeFET depends upon the dipole orientation of the combined ferroelectric material oxide layer 14 of the MFS structure 2. In another embodiment, the MFM structure 5 can be utilized to form a capacitor dielectric of a 1T-1C FeRAM. In this embodiment, the dipole orientation of the combined ferroelectric material oxide layer 14 determines the transient current and voltage level on the bit line during sensing operation (the bit line is connected to the capacitor structure).

The various layers 6, 8, 10 and/or 12 of the structures 2 and 5 depicted in FIGS. 1-3 can be patterned at any time after formation of the layers, either before or after the annealing process to partially crystallize the combined ferroelectric material oxide layer. The patterning of these layers may be carried out by an etch process using an etch mask (e.g., a hard mask), where the patterning of the layers can be carried out based upon the intended use of these layers. For example, the layers may be patterned to define at least part of a gate stack of a 1T FeFET or these layers may be patterned to define a capacitor dielectric of 1T-1C FeRAM. Any suitable spacer structures may also be formed (e.g., utilizing any suitable deposition technique, such as any of the deposition techniques previously described herein) after patterning the layers. Any other further processing of the carrier or support structure to integrate other components in relation to the support structure can be implemented before, after or together with the formation of the MFS structure 2 or MFM structure 5. For example, source/drain regions of the ferroelectric memory cells may be formed before, after or together with the ferroelectric layer.

Figure 5:
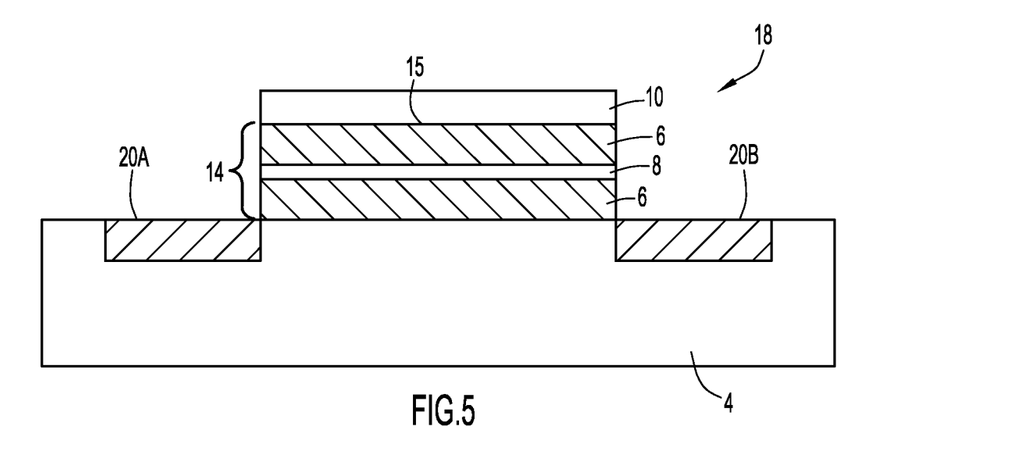
FIG. 5 depicts a cross-sectional view of an example embodiment of an integrated circuit including a planar 1T ferroelectric memory cell including the metal ferroelectric semiconductor (MFS) structure of FIG. 1.

An example embodiment that integrates a MFS structure 2 such as depicted in FIG. 1 in a FeFET memory cell 18 is depicted in the cross-sectional view of FIG. 5. In this embodiment, a planar 1T FeFET comprises the support structure 4 with the MFS structure 2 formed thereon and source/drain regions 20A, 20B formed within the structure 4. The MFS structure 2 is integrated within the FeFET memory cell 18 as a gate layer stack, where conductive layer 10 comprises a gate electrode. In an alternative embodiment, an insulating buffer layer can be formed between the combined ferroelectric oxide layer 14 and the surface of the support structure 4. The insulating buffer layer can be formed of any suitable materials including, without limitation, $SiO_2$ or SiON. It is to be understood that the schematic cross-sectional view of the FeFET memory cell 18 forms a part of an integrated circuit. For example, an integrated circuit may comprise a plurality of FeFET memory cells 18 arranged in the form of a ferroelectric memory cell array. Additional circuits may also be formed in the support structure 4. By way of example, these additional circuits may include word line drive circuits, bit line drive circuits, source line drive circuits, sense circuits, control circuits, and any other suitable circuits for the integrated circuit. In general, any semiconductor devices, e.g.

diodes, bipolar transistors, diffusion resistors, silicon controlled rectifiers (SCR), field effect transistors (FET), may be formed within the support structure 4. In addition, a wiring area including a stack of conductive layers, e.g. metal layers, and intermediate dielectrics may be formed over portions of the support structure 4, where the wiring area may be used to interconnect semiconductor devices or circuit parts of the integrated circuit.

It is further noted that the MFS structure 2 can also be formed with any one or more suitable geometries including, without limitation, planar or 3D geometry such as Gate first transistor, Gate Last transistor devices, Trench MOSFET, FinFET, RCAT ("Recessed Channel Array Transistor"), TSNWFET ("Twin Silicon NanoWire Field Effect Transistor"), PiFET ("Partially insulated Field Effect Transistor"), McFET ("Multi-channel Field Effect Transistor"), including geometries and with different combinations of layers as described in U.S. Pat. No. 8,304,823, the disclosure of which is incorporated herein by reference in its entirety.

Figure 6:
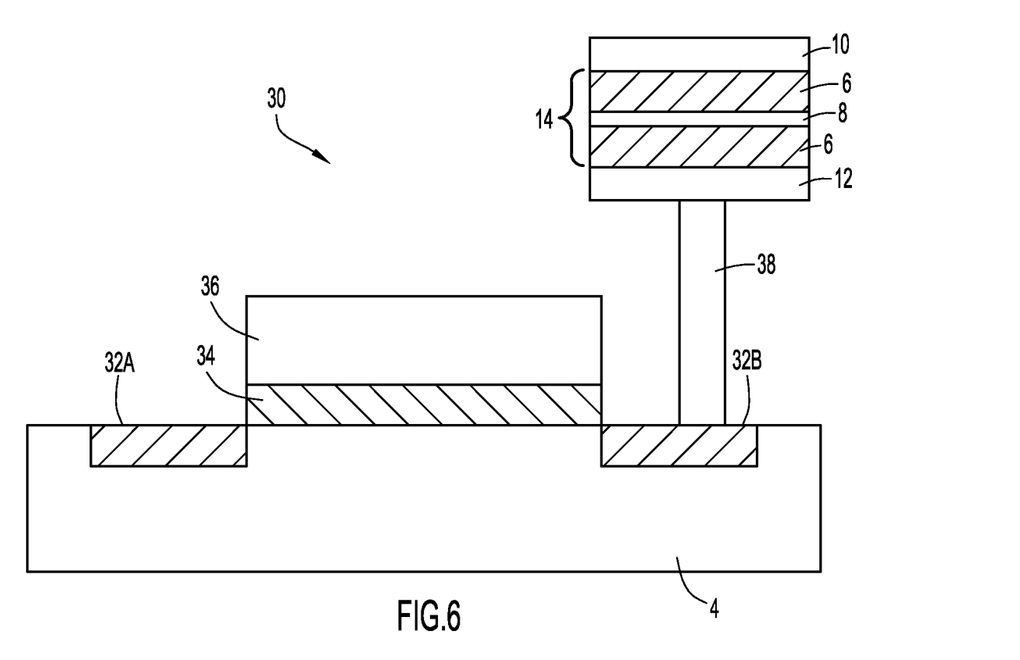
FIG. 6 depicts a cross-sectional view of an example embodiment of an integrated circuit including a planer 1T-1C ferroelectric memory cell including the metal ferroelectric metal (MFM) structure of FIG. 2.

Another example embodiment of a memory cell structure implementing the MFM structure 5 of FIG. 2 is depicted in the cross-sectional view of FIG. 6. In particular, an integrated circuit 30 including a 1T-1C FeRAM memory cell including the MRM structure 5 is shown, in which source/drain regions 32A, 32B are formed within the support structure 4. A conventional FET is provided as an access transistor for the FeRAM memory cell and includes a dielectric layer 34 formed on the support structure 4 with a gate electrode 36 formed over the dielectric layer. The dielectric layer and gate electrode are formed of any conventional or other suitable materials that provide the respective dielectric and conductive properties to such layers. Source/drain region 32B is coupled to a capacitor via an interconnection structure 38 (e.g., a contact plug). The capacitor is defined as the MRM structure 5 of FIG. 2 (with the exception that the MRM structure 5 is directly supported by the interconnection structure 38 instead of the support structure 4). The combined ferroelectric material oxide layer 14 has ferroelectric properties that serve as a ferroelectric dielectric for the capacitor.

While the example embodiments described herein are in relation to 1T ferroelectric memory cells (FeFETs) and 1T-1C ferroelectric memory cells, the present invention is not limited to such memory cells but instead can be applied to any suitable type of ferroelectric memory cell (e.g., 2T-2C memory cells).

Since the presence of the ferroelectric properties is necessarily accompanied by the presence of piezoelectric properties, a ferroelectric memory cell or a piezo element can be formed by using a MFM capacitor structure as previously described herein. Applying a certain voltage to the device will cause a piezoelectric expansion of the device which can be used for different applications where piezo-elements are included in a device to cause a transformation of an input signal (mainly an electrical signal) into motion or to prevent a motion. The main advantage of a $HfO_2$ based piezoelement is that the material is lead free.

The embodiments described herein enhance the performance of a ferroelectric memory cell and avoid the possibility of errors during sensing/write operations associated with the memory cell. As previously noted, the term "writing", as used herein, refers to setting of one of the memory states as either "1" with a high threshold voltage value or "0" with a low threshold voltage value. Thus, the term "writing" can mean one of two sub-operations: programming (setting a high threshold voltage state), or erase (setting a low threshold voltage state). In particular, the amorphous layer provided within a combined ferroelectric material layer including an amorphous layer disposed between ferroelectric material oxide, and further with the doping of suitable additives within the combined ferroelectric material layer, reduces the leakage current that may otherwise occur at the crystal boundaries of the ferroelectric structure and further reduces charge trapping and also increases the endurance of the structure, thus rendering the memory cell more reliable.

In another example embodiment of the present invention, a specifically defined write operation for a 1T ferroelectric memory cell including one or more ferroelectric material oxide layers (such as the combined ferroelectric material oxide layer as previously described herein) can be utilized to significantly reduce sensing times associated with the memory cell without the concern of inaccurate sensing caused by charge trapping within the memory cell. This technique is applicable in relation to the ferroelectric memory cells described herein as well as other types of ferroelectric memory cells (e.g., ferroelectric memory cells of the types described in U.S. Pat. No. 8,304,823, including 1T ferroelectric memory cells having any suitable geometries (e.g., planar or three dimensional) as well as for 1T ferroelectric memory cells with different gate stack structures. It is further noted that this technique can be applied for 1T memory cells utilizing any other ferroelectric materials (PZT, SBT, BTO, BFO) having trap states.

In a write operation of a ferroelectric memory cell, a voltage pulse applied to the ferroelectric material of the memory cell to change its polarity, where this change in polarity corresponds, e.g., with a "0" or a "1" value. When implementing the ferroelectric material within, e.g., a 1T ferroelectric memory cell (e.g., the memory cell depicted in FIG. 5), the memory cell can be written into an "0" state (low threshold voltage state) by applying a pulse of positive coercive voltage, $+U_C$, between a gate electrode and a source/drain/bulk in order to positively polarize the ferroelectric material oxide layer (e.g., the combined ferroelectric material oxide layer 14 as shown in FIG. 5). This procedure is referred as an erase operation. The value of the coercive voltage is the voltage that is required to change the polarity of a particular ferroelectric material, and this value depends upon the ferroelectric oxide material used (and possibly also on which other additives are provided within the ferroelectric oxide material layer). During the program operation, the memory cell is written into an "1" state (high threshold voltage state) by applying a pulse of negative coercive voltage, $-U_C$, between a gate electrode and a source/drain/bulk in order to negatively polarize the ferroelectric material oxide layer (e.g., the combined ferroelectric material oxide layer 14 as shown in FIG. 5). The sensing operation is performed by sensing drain current at 0.1 or 1 V drain voltage, while gate is pulsed at a particular sensing (e.g. read) voltage ($V_{SENSE}$) with source/bulk grounded. The resultant output in drain current associated with the sensing operation will provide an indication of the storage value ("1" or "0") of the memory cell.

When charge trapping occurs within the ferroelectric memory cell the threshold voltage shift is opposite to that induced by ferroelectric switching, which would lead to a false interpretation of the cell state. The complete or partial detrapping would be needed to ensure the sensing—of the true memory state. In particular, sensing access times in the range of several milliseconds are typically required to ensure that sufficient de-trapping of electrons from the ferroelectric material oxide layer(s) of the memory cell has occurred and the true memory state, determined by the ferroelectric polarization can be identified.

Figure 7A:
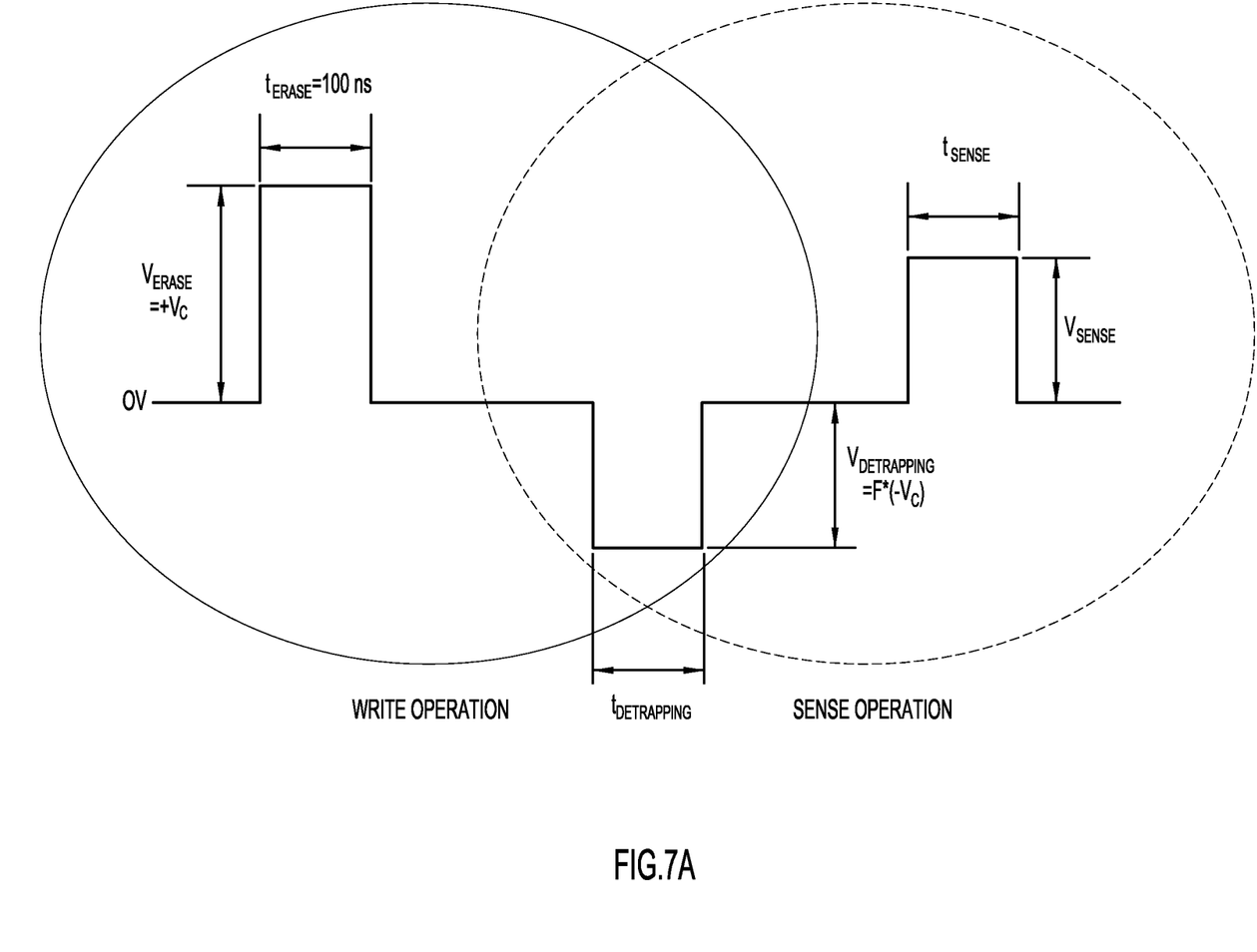
FIG. 7A is a plot of voltage vs. time which shows a pulse sequence comprising erase and subsequent sensing operations for a ferroelectric memory cell in accordance with an example embodiment of the present invention.
Figure 8:
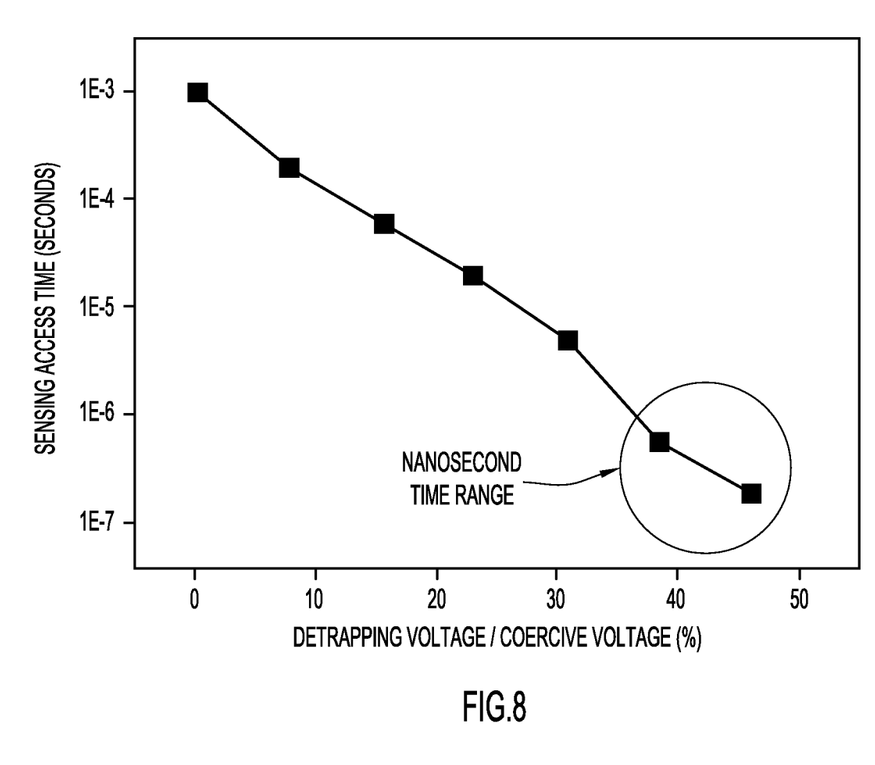
FIG. 8 is a plot of sensing time vs. voltage value of the additionally introduced detrapping pulse from the write pulse sequence of FIG. 7A to show a reduction in sensing time based upon the detrapping pulse utilized in the write pulse sequence.

In accordance with the present invention, a change from typical write operations associated with ferroelectric memory cells is provided, in which a write pulse sequence is applied to a ferroelectric memory cell. In case of the erase operation, as depicted in FIG. 7A, a pulse sequence is applied comprising a positive erase voltage pulse of $+U_C$ followed by a negative detrapping pulse that is some suitable fraction of $-U_C$. In particular, as shown in the plot of FIG. 7A, a positive erase pulse $+U_C$ is applied to the ferroelectric material oxide layer at a suitable pulse time, e.g., about 100 ns (nanoseconds), which ensures the reversal of the polarization, followed by a negative detrapping pulse at a fraction of the $-U_C$ and for about the same pulse time, enabling acceleration of the detrapping process. This results in a significant reduction in the sensing access times (time between write operation and sensing operation) for the memory cell, as indicated in the plot of FIG. 8.

In particular, providing a write pulse sequence as described herein in which a detrapping pulse, $F^*-U_C$ is provided after the write pulse, $+U_C$, where F is a value that is greater than 0 and less than 1, can reduce sensing access times of the memory cell from several milliseconds (standard sensing times to ensure sufficient de-trapping of electrons from a ferroelectric material oxide layer) to a few microseconds or less. For example, referring to the plot of FIG. 7A the detrapping pulse in the erase pulse sequence can be $F^*-U_C$, where F is from about 0.1 to about 0.7. In addition, the erase pulse in the programming pulse sequence can be $F^*-U_C$, where F is from about 0.4 to about 0.5, which reduces the required sensing operation to less than 1 microsecond (e.g., in the nanosecond range).

Figure 7B:
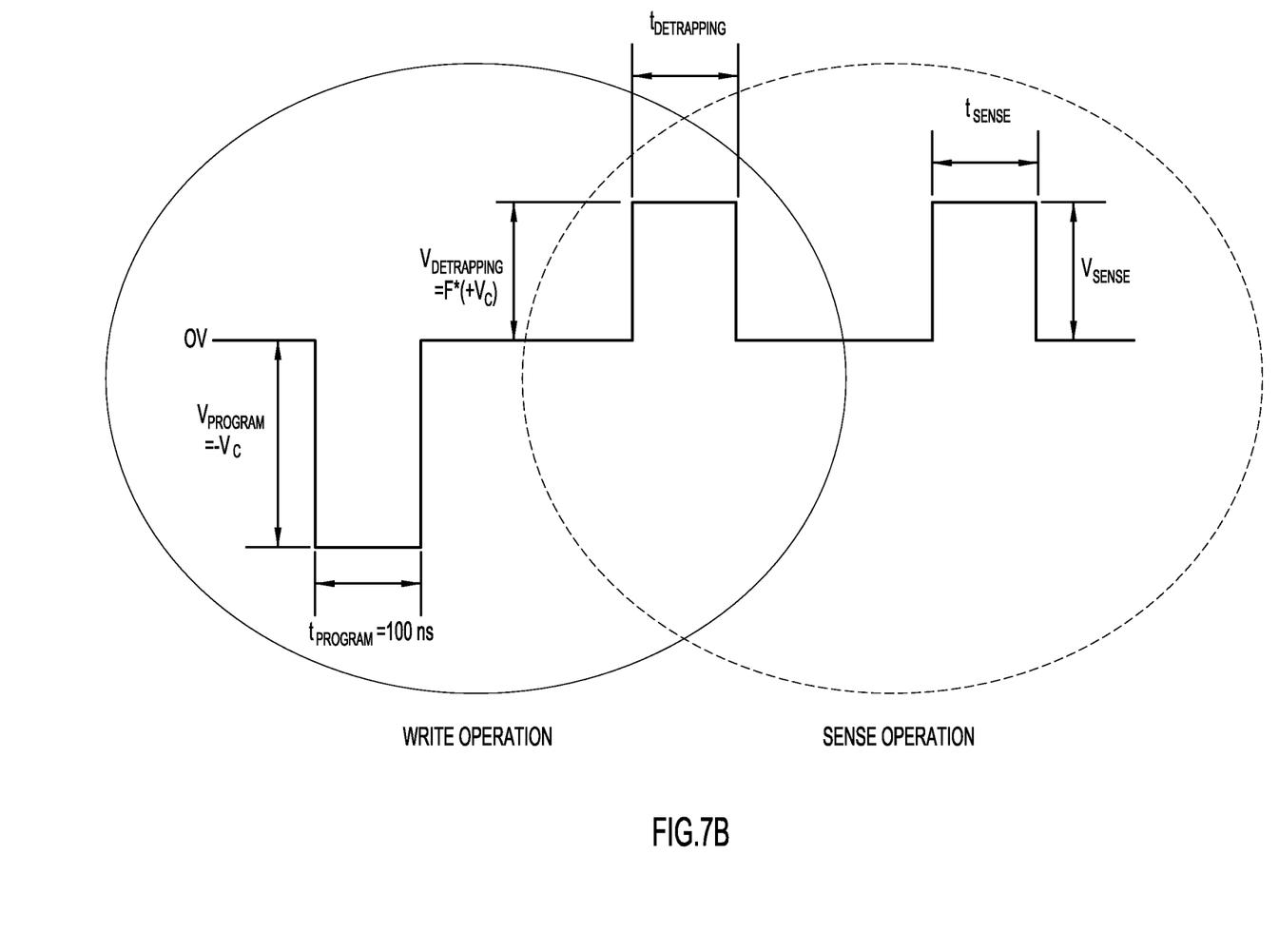
FIG. 7B is a plot of voltage vs. time which shows a pulse sequence comprising programming and subsequent sensing operations for the ferroelectric memory cell described in relation to FIG. 7A.

The improved pulse sequence is not limited to erase operations but is also applicable to other operations associated with the ferroelectric memory cell (e.g., program operations). For the program operation, as depicted in FIG. 7B, it will be a pulse sequence comprising a negative program voltage pulse of $-U_C$ followed by a positive detrapping pulse that is some suitable fraction of $+U_C$. In particular, as shown in the plot of FIG. 7B, a negative program pulse $-U_C$ is applied to the ferroelectric material oxide layer at a suitable pulse time, e.g., about 100 ns (nanoseconds), which ensures the reversal of the polarization, followed by a positive detrapping pulse at a fraction of the $+U_C$ and for about the same pulse time, enabling acceleration of the detrapping process.

In addition, the selection of a specific value of F for the detrapping voltage, $F^*(-U_C)$ or $F^*(+U_C)$, to be applied in the write sequence will depend upon the type of ferroelectric materials and/or additives within such layer(s) utilized in the ferroelectric material oxide layer(s).

The detrapping pulse does not have to be applied right after a write (program or erase) operation but it can of course also be included into the sensing operation directly before the sensing pulse or at some time in between both operations.

Although specific embodiments have been illustrated and described herein, it will be appreciated by those of ordinary skilled in the art that a variety of alternate and/or equivalent implementations may be substituted for the specific embodiments shown and described without departing from the scope of the present invention. This application is intended to cover any adaptions or variations of the specific embodiments discussed herein. Therefore, it is intended that this invention be limited only by the claims and the equivalents thereof.

What is claimed is:

1. An integrated circuit comprising a ferroelectric memory cell, the ferroelectric memory cell comprising:
   a first oxide storage layer;
   a second oxide storage layer; and
   an amorphous layer disposed between the first and second oxide storage layers, wherein the amorphous layer comprises at least one material having a band gap larger than about 5 eV;
   wherein each of the first and second oxide storage layers comprises a ferroelectric material that is at least partially in a ferroelectric state and further comprises, as main components, oxygen and any of the group consisting of Hf, Zr and (Hf, Zr).

2. The integrated circuit of claim 1, wherein the first oxide layer overlies the amorphous layer and the second oxide layer, and the ferroelectric memory cell further comprises:
   a covering layer disposed over the first oxide layer.

3. The integrated circuit of claim 2, wherein the covering layer comprises at least one of TiN, TaN, TaCN, WCN, Ru, Re, RuO, Pt, Ir, IrO, Ti, TiAlN, TaAlN, W, WN, C, Si, Ge, SiGe and NbCN.

4. The integrated circuit of claim 1, wherein the amorphous layer comprises at least one of $Al_2O_3$, $SiO_2$, $Gd_2O_3$, $Sc_2O_3$ and $La_2O_3$.

5. The integrated circuit of claim 1, wherein the amorphous layer comprises at least one material having a band gap in the range from about 5.5 eV to about 6.5 eV.

6. The integrated circuit of claim 1, wherein the first and second oxide layers are about the same thickness.

7. The integrated circuit of claim 1, wherein the first and second oxide layers have different thicknesses.

8. The integrated circuit of claim 1, wherein the thickness of at least one of the first and second oxide layers is in a range from about 2 nm to about 250 nm.

9. The integrated circuit of claim 7, wherein the thickness of the amorphous layer is from about 1 Angstroms to about 100 Angstroms.

10. The integrated circuit of claim 9, wherein at least one of the first and second oxide layers further comprises at least one additive, the at least one additive comprising at least one of C, Si, Al, Ge, Sn, Sr, Pb, Mg, Ca, Sr, Ba, Ti, Zr, Ti, and one or more rare earth elements.

11. The integrated circuit of claim 10, wherein the at least one additive comprises an element having an atomic radius about the same as or greater than Hf.

12. The integrated circuit of claim 10, wherein the at least one additive comprises an element having a valence the same as Hf.

13. The integrated circuit of claim 10, wherein the at least one additive is provided in at least one of the first and second oxide layers at a concentration from about 0.5 at % to about 20 at %.

14. The integrated circuit of claim 10, wherein the at least one additive is provided in at least one of the first and second oxide layers at a concentration from about 0.5 at % to about 10 at %.

15. An integrated circuit comprising a ferroelectric memory cell, the ferroelectric memory cell comprising:
   a first oxide storage layer;
   a bi-layer system comprising at least one bi-layer disposed over the first oxide storage layer, wherein each bi-layer comprises an amorphous layer and an oxide storage layer disposed over the amorphous layer, wherein at least one amorphous layer comprises at least one material having a band gap larger than about 5 eV;
   wherein each of the oxide storage layers comprise a ferroelectric material that is at least partially in a ferroelectric state and further comprises, as main components, oxygen and any of the group consisting of Hf, Zr and (Hf, Zr).

16. The integrated circuit of claim 15, wherein the bilayer system comprises a plurality of bi-layers disposed over the first oxide storage layer.

17. The integrated circuit of claim 16, wherein the plurality of bi-layers comprises no more than about 100 bi-layers.

18. The integrated circuit of claim 16, wherein the plurality of bi-layers comprises no more than about 20 bi-layers.

19. The integrated circuit of claim 1, wherein the ferroelectric memory cell is formed as part of one of a FeFET and a FeRAM.

20. The integrated circuit of claim 15, wherein the ferroelectric memory cell is formed as part of one of a FeFET and a FeRAM.

21. A method for writing a ferroelectric memory, the ferroelectric memory comprising a ferroelectric cell with a ferroelectric storage layer and voltage source to apply a voltage to the ferroelectric storage layer, the method comprising:
    applying a write voltage pulse sequence to the ferroelectric storage layer via the voltage source that includes:
    applying a pulse of a coercive voltage having a value of $U_C$ that is suitable to change a polarity of the ferroelectric storage layer; and
    applying a subsequent pulse of a voltage having a value that is the product of F and -Uc-, wherein F is greater than zero and less than 1.

22. The method of claim 21, wherein F is from about 0.4 to about 0.5.

23. The method of claim 22, wherein the subsequent pulse is applied at any time after the programming voltage pulse.

24. A method for sensing a ferroelectric memory cell, the ferroelectric memory cell comprising a ferroelectric storage layer and voltage source to apply a voltage to the ferroelectric storage layer, the method comprising:
    applying a sensing voltage pulse sequence to the ferroelectric storage layer via the voltage source that includes:
    applying a pulse of a voltage having a value that is the product of F and -Uc-, wherein F is greater than zero and less than 1; and
    applying a sensing pulse having a voltage value that is suitable to sense a polarity of the ferroelectric storage layer.

25. The method of claim 23, wherein F is from about 0.4 to about 0.5.

26. The method of claim 25, wherein the pulse is applied at any time before the sensing voltage pulse.

* * * * *